United States Patent [19]

Munday et al.

[11] Patent Number: 4,904,191
[45] Date of Patent: Feb. 27, 1990

[54] CONTACT STRUCTURE EMPLOYING AN ELASTOMERIC CONNECTOR

[75] Inventors: Mark L. Munday; William P. Doby, both of Raleigh, N.C.

[73] Assignee: Westinghouse Electric Corp., Pittsburgh, Pa.

[21] Appl. No.: 186,424

[22] Filed: Apr. 26, 1988

[51] Int. Cl.$^4$ ................................................ H01R 9/09
[52] U.S. Cl. ...................................... 439/68; 361/395
[58] Field of Search ...................................... 439/66-76; 361/395, 398, 412, 413, 394; 368/84, 88

[56] References Cited

U.S. PATENT DOCUMENTS

| | | | |
|---|---|---|---|
| 4,169,642 | 10/1979 | Mouissie | 439/66 |
| 4,272,838 | 6/1981 | Kasama et al. | 368/84 |
| 4,330,165 | 5/1982 | Sado | 439/66 |
| 4,533,976 | 8/1985 | Suwa | 439/66 |

*Primary Examiner*—Neil Abrams
*Attorney, Agent, or Firm*—B. R. Studebaker

[57] ABSTRACT

A circuit assembly composed of: a one-piece molded support member (8); a first circuit device (32) positioned on the support member (8) and having a row of first contact elements (34) formed to have contact surfaces all lying in a first common plane; a second circuit device (36) having a row of second contact elements (38) formed to have contact surfaces all lying in a second common plane, the second circuit device (36) being secured to, and positioned by, the support member (8) such that the contact surfaces of the second contact elements (38) face the contact surfaces of the first contact elements (34), each first contact element (34) is aligned with a respective second contact element (38), and the first and second common planes are parallel to one another and are spaced a predetermined distance apart; and an elastomeric connector (10) interposed and compressed between the first and second circuit devices (32,36) for conductively connecting each first contact element (34) to the respective second contact element (38) with which the first contact element (34) is aligned.

2 Claims, 3 Drawing Sheets

CONTACT STRUCTURE EMPLOYING AN ELASTOMERIC CONNECTOR

BACKGROUND OF THE INVENTION

The present invention relates to the establishment of conductive connections between two rows of contacts, employing an elastomeric connector. The invention particularly relates to the establishment of such connections between a row of output contacts on a circuit board and a row of input contacts on a liquid crystal display (LCD).

In many electronic applications, such as the establishment of connections between an LCD and a printed circuit board, there is a need for an effective connector element which can simultaneously establish individual connections between two sets of contacts. While it has already been proposed to employ elastomeric connectors, which provide a plurality of closely spaced conductive paths, simple structures which establish a durable low-resistance connection have not heretofore been available, particularly in the context of a structure which can be easily assembled.

It is known in the art to mount an LCD having a flat contact array and a circuit board having output contacts on a stamped metal support member with an elastomeric connector interposed between the LCD and the circuit board to establish connections between their contacts. However, it has been found that support members cannot be formed in this manner to have the dimensional accuracy required to establish a satisfactory and durable conductive connection between the contacts.

SUMMARY OF THE INVENTION

It is an object of the present invention to provide a circuit assembly which allows surface contacts arranged in two planar rows to be reliably connected together by an elastomeric connector.

Another object of the invention is to permit such assembly to be formed in a rapid and simple manner.

Yet another object of the invention is to establish and maintain a high degree of parallelism between the two rows of surface contacts.

The above and other objects are achieved, according to the present invention by a circuit assembly comprising: a one-piece molded support member; a first circuit device positioned on the support member and having a row of first contact elements formed to have contact surfaces all lying in a first common plane; a second circuit device having a row of second contact elements formed to have contact surfaces all lying in a second common plane, the second circuit device being secured to, and positioned by, the support member such that the contact surfaces of the second contact elements face the contact surfaces of the first contact elements, each first contact element is aligned with a respective second contact element, and the first and second common planes are parallel to one another and are spaced a predetermined distance apart; and an elastomeric connector interposed and compressed between the first and second circuit devices for conductively connecting each first contact element to the respective second contact element with which the first contact element is aligned.

DESCRIPTION OF THE PREFERRED EMBODIMENTS

Figure 1:
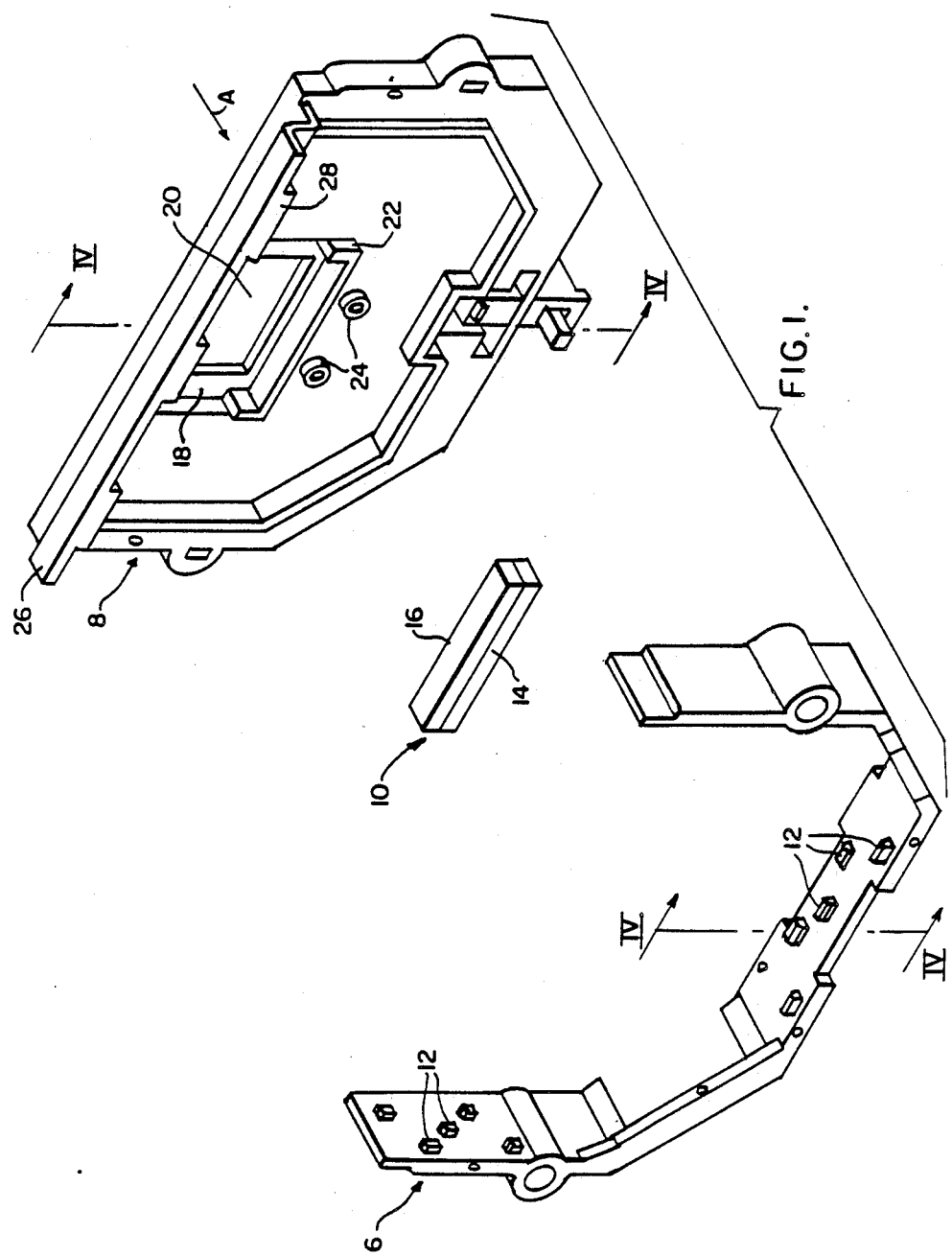
FIG. 1 is an exploded, perspective view illustrating several components of a connecting structure according to the present invention.

FIG. 1 illustrates, by way of example, two housing components of an electronic register assembly for use in a power utility meter, as described in greater detail in a copending U.S. application filed concurrently with the present application by Munday, Doby and Loose, entitled ELECTRICITY METER ACCEPTING INTERCHANGEABLE FUNCTIONAL MODULES. To the extent necessary, that disclosure is incorporated herein by reference.

These components include a card holder 6 constructed for supporting a printed circuit board, or card, having output terminals for supplying power and data signals to an LCD.

A front cover member 8 is provided to support the LCD, and an elastomeric connector 10 is provided for establishing the connections between the output terminals of the printed circuit card and the input terminals provided on the LCD.

Card holder 6 is provided with bosses 12 for accurately positioning the side and bottom edges of a printed circuit board. In the illustrated embodiment, the printed circuit board can be placed in any one of several positions, depending on the nature of the circuit structure provided on the board.

Elastomeric connector 10 is composed of a flexible conductive strip 14 and a foam backing strip 16. Connector 10 can be constituted by a commercially available product marketed by P.C.K. Elastomerics, Inc., under the designation Carbon Stax Series. Such connectors can be obtained with dimensions specified by the customer.

Front holder 8 is a one-piece, molded structure formed to have a recessed region 18 for housing an LCD, the center of recessed region 18 being provided with an opening 20 via which the display portion of the LCD can be viewed from in front of cover 10.

Along the bottom and the lower part of the sides of recessed region 18, there is provided a raised ledge 22 for supporting both the lower edge of the LCD and elastomeric connector 10. Thus, ledge 22 supports both the lower surface and the longitudinal ends of connector 10.

Beneath, and close to the lower surface of, ledge 22 there are provided two projecting bosses 24 each provided with a tapped blind bore for receiving a connecting element, such as a machine screw, having a mating thread.

Along the upper edge of front cover 8 there is provided a flange member 26 having, along its rear surface, a plurality of downwardly projecting lips 28 which delimit a channel for retaining the upper edge of the printed circuit board.

When card holder 6 and front cover 8 are assembled together, with connector 10 interposed between the printed circuit board mounted in card holder 6 and the input contacts of the LCD housed in recessed region 18, and with the upper edge of the printed circuit board installed in the channel delimited by lips 28, two threaded connectors are inserted through the printed circuit board and into the threaded bores in bosses 24 and the threaded connectors are tightened down in order to press the printed circuit board against the free ends of bosses 24 to thereby compress connector 10 and establish a secure electrical connection.

The spacing between the contacts on the printed circuit board and those on the LCD is thus accurately defined by the height of bosses 24. This spacing is further defined by the height of ledge 22 which can be precisely equal to the height of bosses 24 or slightly less than the height of those bosses. Ledge 22 primarily helps to assure that the contact region of the printed circuit board will be maintained essentially planar so that the spacing between the printed circuit board contacts and the LCD contacts will be uniform.

The positioning of the printed circuit board is further assured by the action of bosses 12 on card holder 6 and the channel delimited by lips 28. Since, however, these connecting points are further removed from the region where the printed circuit board contacts connector 10, the accuracy with which bosses 12 and lips 28 are located on the respective parts is less critical to accurate positioning of the printed circuit board output contacts.

Front cover 8 further includes a latching assembly, which is shown at the lower edge of cover 8, which forms no part of the present invention and will therefore not be described further.

Figure 2:
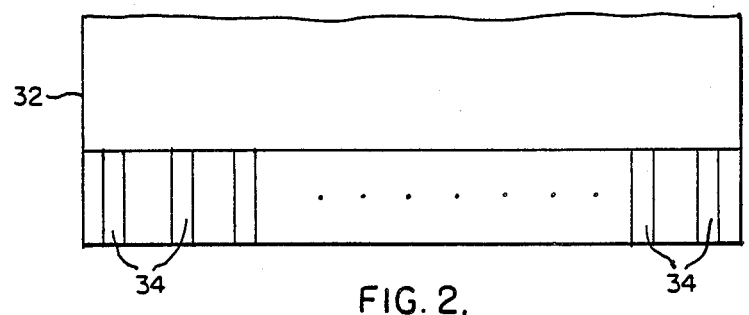
FIG. 2 is a detail view of a portion of one component which is to be installed in the arrangement of FIG. 1 and which possesses a first row of surface contacts.
Figure 3:
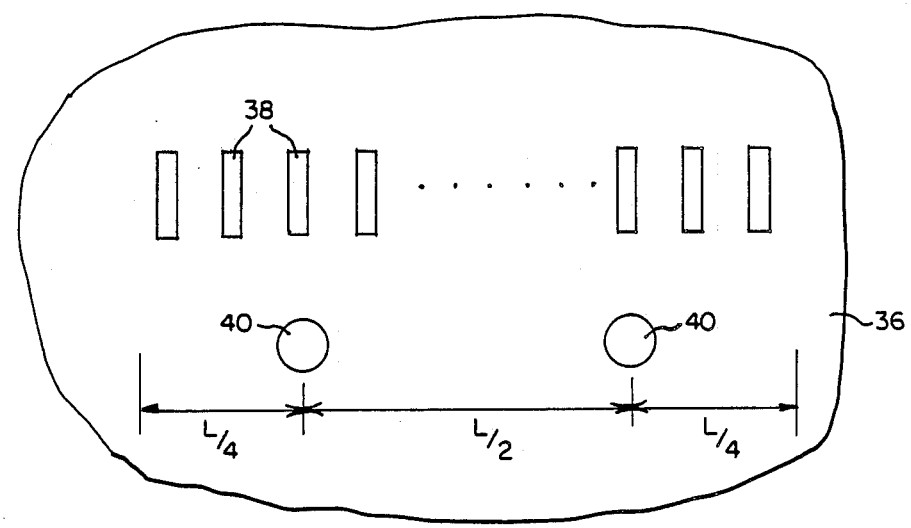
FIG. 3 is a detail view of a second component which is to be installed in the arrangement of FIG. 1 and which presents a second row of surface contacts.

FIG. 2 is a detail view illustrating the lower portion of the rear surface of an LCD 32. Along the lower edge of LCD 32 there are disposed a series of conductive contacts 34 which extend along the length of the device, only a small number of the contacts being shown in FIG. 2. Elastomeric connector 10 will be pressed against contacts 34 so that a conductive path is established to each contact individually. FIG. 3 illustrates a portion of a printed circuit board which may be installed in card holder 6 of FIG. 1.

FIG. 3 is a detail view of the output connector region of a printed circuit board 36. Board 36 is provided, in the output connector region, with a plurality of output contacts 38 positioned to be in alignment with respect of ones of contacts 34 when circuit board 36 is assembled to front cover 8 of FIG. 1. The printed circuit board is further provided with two openings 40 for receiving the threaded connectors which will secure board 36 to bosses 24.

Card holder 6 and front cover 8 can be held together in any suitable manner, such as by a connecting member extending through passages located at the sides of those members. A suitable connecting structure is described in detail in the above-cited copending application.

Figure 4:
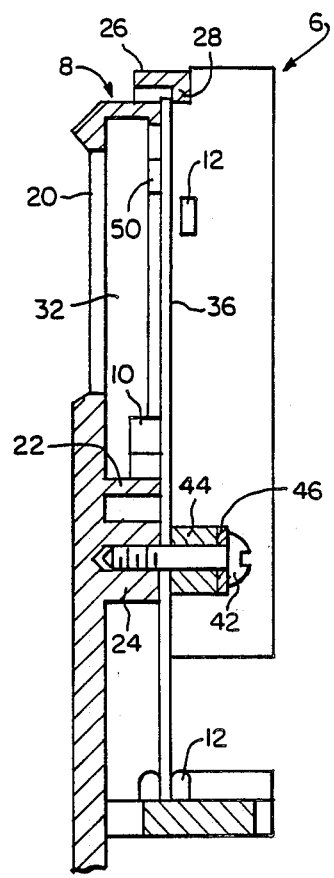
FIG. 4 is a cross-sectional view taken along the plane 4—4 of FIG. 1.

FIG. 4 is a cross-sectional view taken along the median plane of card holder 6 and front cover 8, showing the card holder 6 and front cover 8 assembled together with printed circuit board 36 secured to bosses 24 by threaded connectors, e.g., machine screws, with a cylindrical standoff 44 and a lock washer 46 interposed between the head of connector 42 and the rear surface of board 36.

When board 36 is secured in place, elastomeric connector 10 is compressed to establish a secure and reliable connection between contacts 34 and 38.

It has been found that the establishment of a reliable and durable connection between such contacts, using an elastomeric connector, requires that the connector be compressed by an accurately determined amount and that the degree of compression be uniform along the length of elastomeric connector 10, i.e., in the direction perpendicular to the plane of FIG. 4.

In order to achieve this relationship in a superior manner, front cover 8 is molded as a one-piece unit in such a manner that the surface of recessed region 18 which supports LCD 32 as well as the supporting surfaces of bosses 24 and ledge 22 are formed by the same mold half. This requires that the separation plane of the mold employed to form front cover 8 be parallel to those bearing surfaces.

Figure 5:
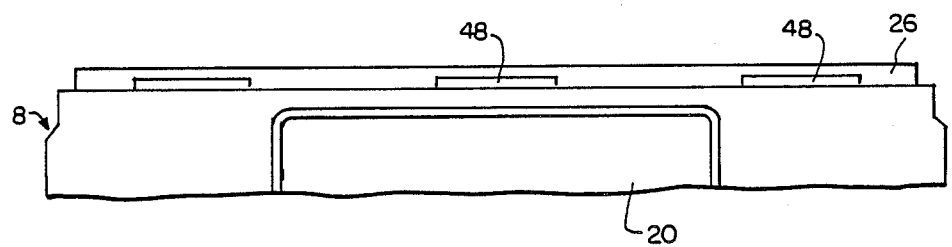
FIG. 5 is a detail view taken in the direction of the arrow A of FIG. 1.

To accomplish this result, while simultaneously forming the flange member 26 and lips 28 illustrated in the drawings, the old halves must be configured so that the surfaces of lips 28 which contact board 36 are formed by the other mold half. This can be done by having the portions of the other mold half which form those lip surfaces leave openings 48 in front cover 8, as shown in FIG. 5, which is a detail view o the front surface of front cover 8.

For the purpose of assuring that the bearing surfaces of bosses 24 accurately define the desired position for board 36, bosses 24 are tapped and any extraneous material formed during the tapping operation is removed before assembly of board 36 thereto.

In addition, the spacing between bosses 24 is selected to provide the most uniform support possible for the connecting region of board 36. By way of example, this can be achieved by spacing bosses 24 from one another by a distance equal to one-half the length of the connecting region, and disposing bosses 24 symmetrically with respect to the median plane of the connecting region. These relationships are depicted in FIG. 3, with respect to the centers of openings 40, where L is the length of the connecting region. A larger number of tapped bosses 24 could be provided to more precisely position the circuit board contacts, particularly if connector 10 must have a relatively great length. However, it has been found that two bosses 24 provide satisfactory support for LCD's having the most commonly employed dimensions.

It will be observed from the drawings that, in accordance with the present invention, the connecting region of board 36 where contacts 38 are disposed is spaced inwardly from the edges of board 36. Thus, while accurate positioning of the contact region is aided by the components which retain the edges of board 36, the dimensional tolerances of the components supporting the edges of board 36 are less critical to maintenance of the desired plane-parallel relation between contacts 34 and 38.

To further assist in establishing such plane-parallel relationship, contacts 38 are specially formed so that the surfaces thereof which contact elastomeric connector 10 all lie in substantially the same plane. This can be achieved, for example, either by forming contacts 38 by plating, or by the application of solder followed by hot air leveling before the solder has set.

It has been found that the present invention enables output contacts 38 to be formed of a tin-lead solder composition since, when elastomeric connector 10 is compressed to a proper extent, this connector will create an effective seal for the exposed surfaces of contact 38.

In order to achieve a low resistance and reliable connection between contacts 34 and 38, it is generally recognized that elastomeric connector 10 must be subjected to a certain degree of compression in the direction between those contacts, and it is generally considered that a compression of between 5 and 20% is needed to provide good contact while minimizing the danger that conductive strip 14 will assume a permanent set. According to the present invention, it has been found preferable to impose a nominal compression of the order 12%, which will allow for fluctuations, due primarily to irregularities at the surface containing contacts 34.

A flat LCD of the type which would be employed for element 32 is normally manufactured to have a relatively planar surface in the region of contacts 34. Any irregularities which exist at the contact surface of a commercially available LCD of this type can be compensated by the connecting arrangement according to the present invention.

Because recessed region 18 and the bearing surfaces of bosses 24 and ledge 22 are formed by the same mold half, and because the bearing surfaces of bosses 24 accurately define the position of contacts 38, while the bearing surface of ledge 22 maintains the board region containing contacts 38 in a flat state, contacts 38 will contribute very little to any deviations in the spacing between those contacts and contacts 34.

It has been found that when the above conditions are respected, elastomeric connector 10 seals contacts 38 to an extent sufficient to prevent contact deterioration even in an environment characterized by large temperature and humidity variations and a polluted atmosphere having, for example, a high sulfur content. As a result, the tendency of tin-lead solders to be deteriorated by these conditions is minimized.

It is desirable that the vertical height of conductive strip 14 be kept at a small value so that the compression forces generated during compression of elastomeric connector 10 will be maintained at a low value, it being understood that, for a given degree of compression, the resulting compression forces will be proportional to the height of conductive strip 14. If large compression forces are generated, the tendency of conductive strip 14 to acquire a permanent set will be increased. If a permanent set occurs, the ability of conductor strip 14 to adapt to variations in the distance between contacts 34 and 38, due for example to temperature variations, will be impaired.

In an exemplary embodiment of the invention, which has been manufactured for commercial use, conductive strip 14 has a height of the order of 0.12 cm (0.047 inch) and an initial width, this dimension being in the direction between contacts 38 and 34, of the order of 0.4 cm (0.155 inch). Conductive strip 13 should extend horizontally beyond the ends of the array of contacts 38.

In this embodiment, foam backing strip 16, which additionally performs an insulating function with respect to the circuitry on board 36, has a height of the order of 0.24 cm (0.093 inch).

Two bosses 24 will provide a sufficiently uniform support if the overall length of connector 10 is not overly large. In the device which has been constructed according to an exemplary embodiment of the invention, an elastomeric connector having a length of the order of 6.38 cm (2.51 inches) was employed. If elastomeric connector 10 must be given a significantly greater length, it might prove necessary to provide three or more bosses 24.

When a tin-lead solder is employed, it is desirable that soldermask not be present between the contacts.

While an embodiment employing tin-lead solder contacts has been described, it would also be possible to employ conductive inks to form contacts 38. In this case, it is desirable to have soldermask between the contacts in order to minimize ink bleeding and to provide improved planarity. The presence of soldermask between the conductive ink contacts helps to maintain dimensional integrity of the contacts and provides a level, i.e., planar, surface in the region of the contact.

The reliability and security of the contact between the conductive strip 14 of connector 10 and contacts 34 and 3 is improved if undesired distortions of conductive strip 14 are avoided, or at least minimized. This object is achieved, in the arrangement according to the present invention, in that substantially the entirety of the lower surface of conductive strip 14 is supported by ledge 22, while the upper surface of conductor strip 14 is supported to a certain extent by foam backing strip 16. Foam backing strip 16 provides limited support for conductive strip 14 and helps prevent twisting and bowing of that strip, while permitting limited vertical expansion, as a result of the horizontal compression experienced by conductive strip 14, and helping to prevent conductive strip 14 from undergoing any degree of permanent set which would increase contact resistance.

Preferably, bosses 24 are placed as close as possible to ledge 22, taking into account mold structure requirements, so that positional deviations between the bearing surfaces of bosses 24 and the connecting surfaces of contact 38 are minimized.

Finally, LCD 32 is maintained in position by two spacers 50, only one of which is visible in 4, which may be of a resilient material.

A particular aspect of the present invention is the arrangement of contacts in a single row. This permits the desired uniform contact spacing a elastomer compression to be achieved with a simple support structure and a minimum of connecting components

What is claimed:

1. A circuit assembly comprising: a one-piece molded support member having first and second planar support surfaces which extend parallel to one another, with both of said planar support surfaces facing in the same direction; a first circuit device positioned on said first planar support surface and having a row of first contact elements formed to have contact surfaces all lying in a first common plane; a second circuit device having a first planar surface and having a row of second contact elements disposed on said first planar surface and formed to have contact surfaces all lying in a second common plane, said second circuit device being secured to said support member such that said first planar surface of said second circuit device bears against said second planar support surface and said contact surfaces of said second contact elements face said contact surfaces of said first contact elements, each first contact element is aligned with a respective second contact element, and said first and second common planes are parallel to one another and are spaced a predetermined distance apart; and an elastomeric connector interposed and compressed between said first and second circuit devices for conductively connecting each first contact element to the respective second contact element with which said first contact element is aligned, wherein said support member has two projecting parts each having an outer surface consisting a part of said second support surface, and said support member further has a third planar support surface located to extend alongside and parallel to said row of second contact elements when said second circuit device is secured to said support member, said third support surface being at least approximately coplanar with said second support surface and being located to oppose warping of said row of second contact elements; wherein said support member is molded in a mold having two mold halves and said first and second support surfaces are formed by one of the mold halves; wherein said support member has two projecting parts each having an outer surface constituting a part of said second support surface; and wherein each said projecting part has a tapped opening and further comprising threaded connectors engaging in said tapped openings for securing said second circuit device to said projecting parts.

2. A circuit assembly as defined in claim 1 wherein each said tapped opening is formed before receiving a respective threaded connector.

* * * * *